United States Patent
Chang et al.

(10) Patent No.: US 8,898,439 B2
(45) Date of Patent: Nov. 25, 2014

(54) SERIAL FLASH MEMORY AND ADDRESS TRANSMISSION METHOD THEREOF

(75) Inventors: Kuen-Long Chang, Taipei (TW); Yufe-Feng Lin, Dasi Township, Taoyuan County (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 824 days.

(21) Appl. No.: 12/837,823

(22) Filed: Jul. 16, 2010

(65) Prior Publication Data
US 2011/0016288 A1  Jan. 20, 2011

Related U.S. Application Data

(63) Continuation-in-part of application No. 12/813,395, filed on Jun. 10, 2010, now Pat. No. 8,677,100.

(60) Provisional application No. 61/226,569, filed on Jul. 17, 2009.

(51) Int. Cl.
| | |
|---|---|
| G06F 9/34 | (2006.01) |
| G11C 7/10 | (2006.01) |
| G06F 9/30 | (2006.01) |
| G06F 9/38 | (2006.01) |

(52) U.S. Cl.
CPC .............. *G11C 7/10* (2013.01); *G06F 9/30149* (2013.01); *G06F 9/342* (2013.01); *G06F 9/3875* (2013.01)
USPC ............ 712/225; 711/212; 711/214; 712/210

(58) Field of Classification Search
CPC ............ G06F 9/30181; G06F 9/30149; G06F 9/3822; G06F 9/3836; G06F 9/342; G06F 9/3824; G06F 12/0292; G06F 12/0246
USPC ......... 711/214, 212, 229, 200, 202, 103, 218; 712/43, 210, 229, 205, 225
See application file for complete search history.

(56) References Cited

U.S. PATENT DOCUMENTS

| | | | | |
|---|---|---|---|---|
| 4,400,768 A | * | 8/1983 | Tomlinson | 712/2 |
| 4,467,443 A | * | 8/1984 | Shima | 711/206 |
| 4,754,435 A | * | 6/1988 | Takamatsu | 365/230.03 |
| 4,790,025 A | * | 12/1988 | Inoue et al. | 382/293 |
| 4,985,867 A | * | 1/1991 | Ishii et al. | 365/221 |

(Continued)

FOREIGN PATENT DOCUMENTS

JP    2009230548 A   * 10/2009

*Primary Examiner* — Aimee Li
(74) *Attorney, Agent, or Firm* — McClure, Qualey & Rodack, LLP

(57) ABSTRACT

A serial flash memory and an address transmission method thereof. The serial flash memory selectively addresses a first memory space according to a first address length or addresses a second memory space according to a second address length longer than the first address length. If the first memory space is addressed according to the first address length, a first memory address is completely received within an address time duration so that data corresponding to the first memory address is initially outputted from a starting clock. In the address transmission method, if the second memory space is addressed according to the second address length, a portion of a second memory address is received within the address time duration. The other portion of the second memory address is received within a waiting time duration so that data corresponding to the second memory address is initially outputted from the starting clock.

14 Claims, 8 Drawing Sheets

(56) References Cited

U.S. PATENT DOCUMENTS

| | | | |
|---|---|---|---|
| 6,247,100 B1 * | 6/2001 | Drehmel et al. | 711/141 |
| 6,477,613 B1 * | 11/2002 | Arimilli et al. | 711/3 |
| 6,766,433 B2 * | 7/2004 | Circello et al. | 711/202 |
| 7,237,071 B2 * | 6/2007 | Jahnke | 711/150 |
| 7,330,381 B2 * | 2/2008 | Zink et al. | 365/189.07 |
| 7,334,116 B2 * | 2/2008 | Iwata | 712/300 |
| 7,369,447 B2 * | 5/2008 | Louie et al. | 365/189.05 |
| 7,382,637 B1 * | 6/2008 | Rathnavelu et al. | 365/49.17 |
| 7,657,696 B2 * | 2/2010 | Su et al. | 711/103 |
| 7,877,566 B2 * | 1/2011 | Adusumilli | 711/169 |
| 7,895,402 B2 * | 2/2011 | Lee et al. | 711/154 |
| 2002/0048197 A1 * | 4/2002 | La | 365/193 |
| 2006/0195650 A1 * | 8/2006 | Su et al. | 711/103 |
| 2009/0204777 A1 * | 8/2009 | Norman | 711/163 |

* cited by examiner

SERIAL FLASH MEMORY AND ADDRESS TRANSMISSION METHOD THEREOF

This is a continuation-in-part application of application Ser. No. 12/813,395, filed on Jun. 10, 2010 and this application claims the benefit of U.S. provisional application Ser. No. 61/226,569, filed Jul. 17, 2009, the subject matter of which is incorporated herein by reference.

BACKGROUND OF THE INVENTION

1. Field of the Invention

The invention relates to a serial memory, and more particularly to a serial flash memory and an address transmission method thereof.

2. Description of the Related Art

In the prior art, serial flash memories have been widely applied to various electronic products. The serial flash memory receives a clock signal and a chip select signal through a clock signal pin and a chip select pin, respectively, and sequentially receives operation commands, memory addresses and data corresponding to the memory addresses through an input/output pin.

However, the address length of the memory address received, through the input/output pin, by the conventional serial flash memory is equal to 24 bits, which only can address the memory space of 128M bits. Thus, the application of the conventional serial flash memory is restricted to the memory space that can be addressed thereby.

SUMMARY OF THE INVENTION

The present invention is directed to a serial flash memory and an address transmission method thereof of transmitting one portion of a memory address within an address time duration and transmitting the other portion of the memory address within a waiting time duration. Consequently, the memory space that can be addressed by the serial flash memory can be increased, and the starting time of outputting data can further be kept unchanged.

According to a first aspect of the present invention, a serial flash memory is provided. The serial flash memory selectively addresses a first memory space according to a first address length or addresses a second memory space according to a second address length longer than the first address length. The serial flash memory includes a memory array and an interface. If the first memory space is addressed according to the first address length, the interface completely receives a first memory address within an address time duration, so that data corresponding to the first memory address is initially outputted from a starting clock. If the second memory space is addressed according to the second address length, the interface receives one portion of a second memory address within the address time duration, and receives the other portion of the second memory address within a waiting time duration, so that data of the memory array corresponding to the second memory address is initially outputted from the starting clock. Address lengths of the first memory address and the second memory address are respectively equal to the first address length and the second address length.

According to a second aspect of the present invention, an address transmission method of a serial flash memory is provided. The serial flash memory using the address transmission method selectively addresses a first memory space according to a first address length or addresses a second memory space according to a second address length longer than the first address length. A first memory address is completely received within an address time duration if the first memory space is addressed, so that data corresponding to the first memory address is initially outputted from a starting clock. The address transmission method includes the following steps. One portion of a second memory address is received within the address time duration if the second memory space is addressed according to the second address length. Address lengths of the first memory address and the second memory address are respectively equal to the first address length and the second address length. Then, the other portion of the second memory address is received within a waiting time duration so that data corresponding to the second memory address is initially outputted from the starting clock.

The invention will become apparent from the following detailed description of the preferred but non-limiting embodiments. The following description is made with reference to the accompanying drawings.

DETAILED DESCRIPTION OF THE INVENTION

In order to expand the memory space that can be addressed by a serial flash memory, a serial flash memory and an address transmission method thereof are provided in the following embodiments. The serial flash memory selectively addresses a first memory space according to a first address length or addresses a second memory space according to a second address length longer than the first address length. The serial flash memory includes a memory array and an interface. If the first memory space is addressed according to the first address length, the interface completely receives the first memory address within an address time duration, so that data corresponding to the first memory address is initially outputted from a starting clock. If the second memory space is addressed according to the second address length, the interface receives one portion of the second memory address within an address time duration, and receives the other portion of the second memory address within a waiting time duration, so that data of the memory array corresponding to the second memory address is initially outputted from a starting clock. Address lengths of the first memory address and the second memory address are respectively equal to the first address length and the second address length.

The serial flash memory using the address transmission method selectively addresses the first memory space according to the first address length or addresses the second memory space according to the second address length longer than the first address length. If the first memory space is addressed, the first memory address is completely received within the address time duration, so that the data corresponding to the first memory address is initially outputted from the starting clock. The address transmission method of this serial flash memory includes the following steps. If the second memory space is addressed according to the second address length, the one portion of the second memory address is received within the address time duration. The address lengths of the first memory address and the second memory address are respectively equal to the first address length and the second address length. In addition, the other portion of the second memory address is received within the waiting time duration so that the data corresponding to the second memory address is initially outputted from the starting clock.

First Embodiment

Figure 1:
FIG. 1 is a schematic illustration showing the exterior of a serial flash memory.
Figure 2:
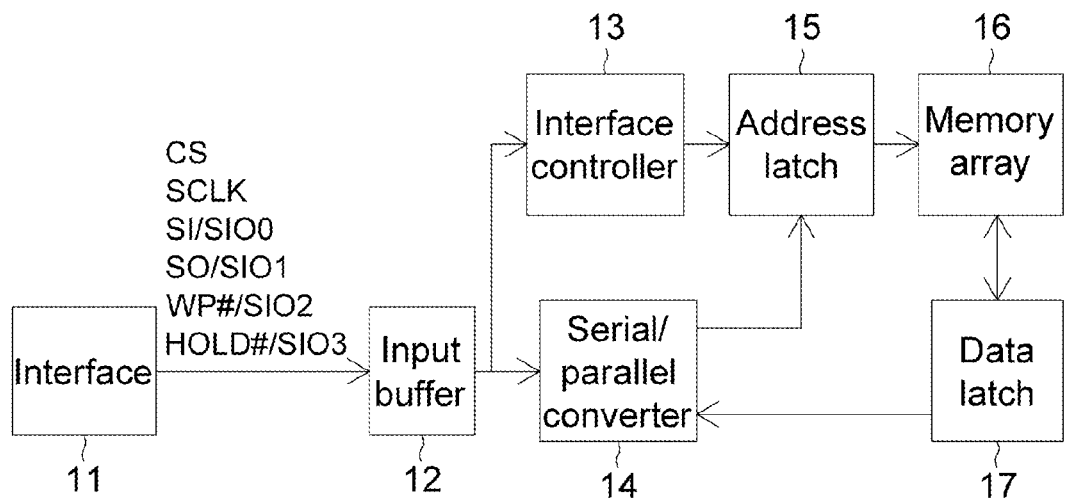
FIG. 2 is a block diagram showing the serial flash memory.
Figure 3:
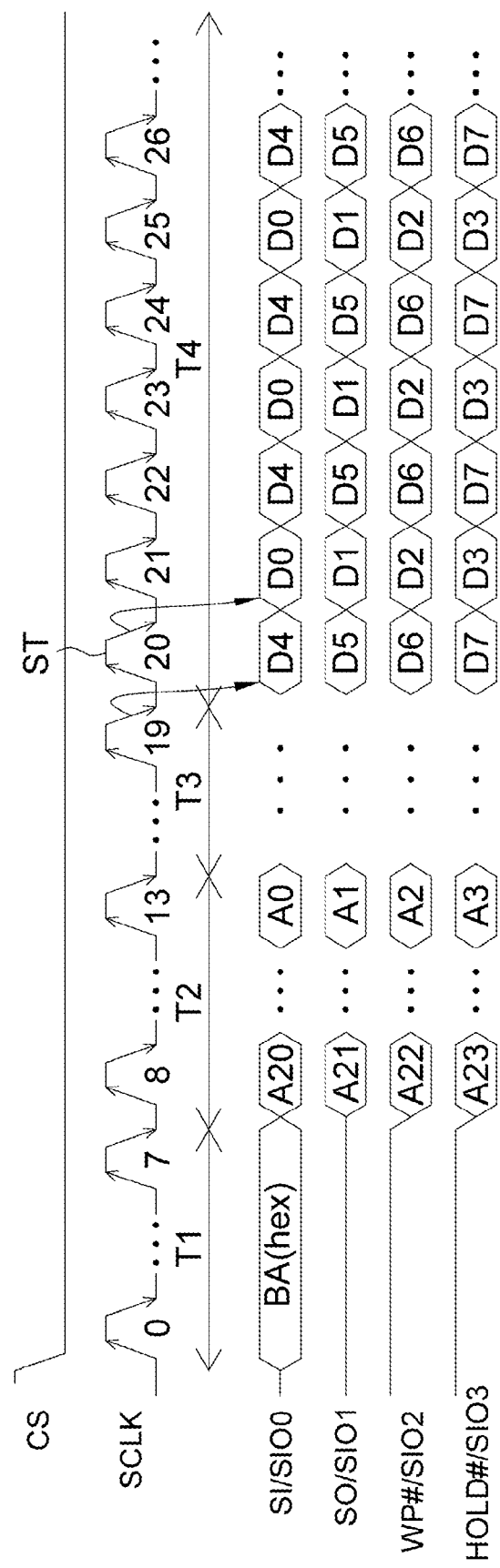
FIG. 3 is a signal timing diagram showing that the serial flash memory is receiving a first memory address.
Figure 6:
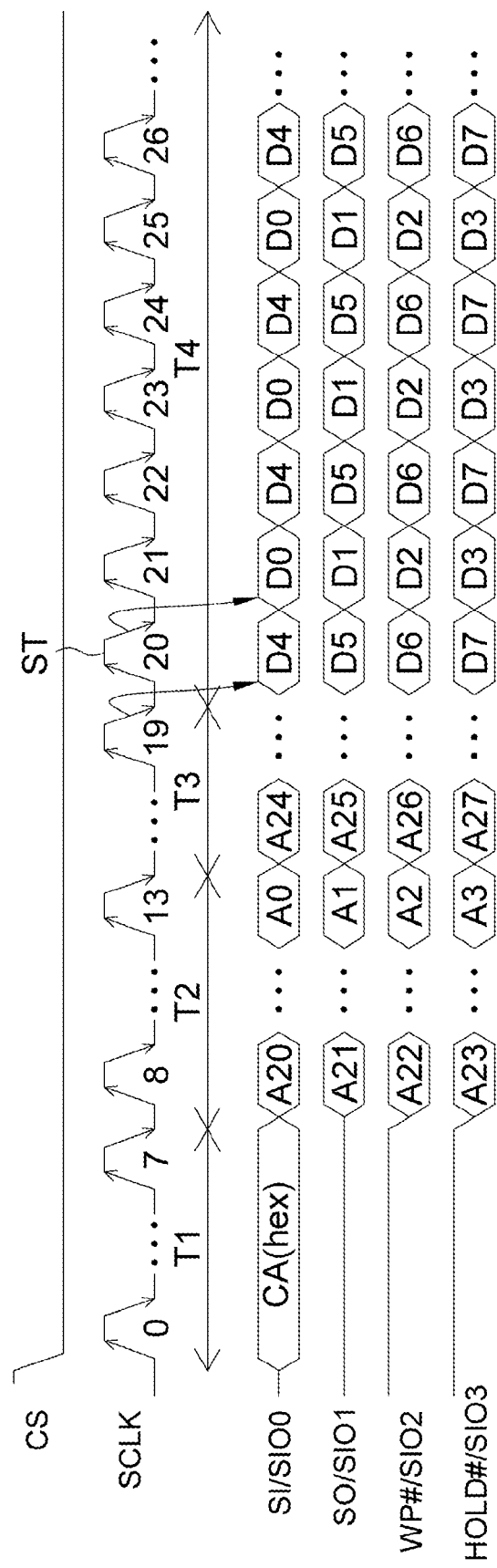
FIG. 6 is a signal timing diagram showing that a serial flash memory is receiving a second memory address according to a first embodiment of the invention.

FIG. 1 is a schematic illustration showing the exterior of a serial flash memory 1. FIG. 2 is a block diagram showing the serial flash memory 1. FIG. 3 is a signal timing diagram showing that the serial flash memory 1 is receiving a first memory address. FIG. 6 is a signal timing diagram showing that the serial flash memory is receiving a second memory address according to the first embodiment of the invention. Referring to FIGS. 1, 2, 3 and 6, the serial flash memory 1 includes an interface 11, an input buffer 12, an interface controller 13, a serial/parallel converter 14, an address latch 15, a memory array 16 and a data latch 17. The serial flash memory 1 selectively addresses a first memory space according to a first address length or addresses a second memory space according to a second address length longer than the first address length. For example, the first address length and the second address length are respectively equal to 24 and 28 bits, and the first memory space and the second memory space are respectively equal to 128M bits and 2 G bits.

The interface 11 includes a chip select pin 111, a clock signal pin 112, an input/output pin 113, an input/output pin 114, an input/output pin 115, an input/output pin 116, a power pin 117 and a grounding pin 118. The chip select pin 111 and the clock signal pin 112 respectively transmit a chip select signal CS and a clock signal SCLK, while the input/output pins 113 to 116 respectively transmit an input/output pin signal SI/SIO0, an input/output pin signal SO/SIO1, an input/output pin signal WP#/SIO2 and an input/output pin signal HOLD#/SIO3. The power pin 117 and the grounding pin 118 are respectively coupled to a voltage level VCC and a grounding level GND. The input/output pin signal SI/SIO0 transmits an operation command within a command time duration T1. The input/output pin signal SI/SIO0, the input/output pin signal SO/SIO1, the input/output pin signal WP#/SIO2 and the input/output pin signal HOLD#/SIO3 transmit one portion of a first memory address A[23: 0] or a second memory A[27: 0] within an address time duration T2, and transmit the other portion of the second memory A[27: 0] within a waiting time duration T3. The input/output pin signal SI/SIO0, the input/output pin signal SO/SIO1, the input/output pin signal WP#/SIO2 and the input/output pin signal HOLD#/SIO3 transmit the data corresponding to the first memory address or the second memory address within a data output time duration T4.

The input buffer 12 is coupled to the interface 11, the interface controller 13 and the serial/parallel converter 14, and temporarily stores the chip select signal CS, the clock signal SCLK, the input/output pin signal SI/SIO0, the input/output pin signal SO/SIO1, the input/output pin signal WP#/SIO2 and the input/output pin signal HOLD#/SIO3. The interface 11 receives the chip select signal CS, the clock signal SCLK, input/output pin signal SI/SIO0, the input/output pin signal SO/SIO1, the input/output pin signal WP#/SIO2 and the input/output pin signal HOLD#/SIO3.

The serial/parallel converter 14 converts the first memory address A[23: 0] or the second memory address A[27: 0], which is serially inputted from the interface 11, into the address that is outputted in parallel. The address lengths of the first memory address A[23: 0] and the second memory address A[27: 0] are respectively equal to the first address length and the second address length. The interface controller 13 controls the address latch 15 to latch the first memory address A[23: 0] or second memory address A[27: 0], which is outputted in parallel, and the data latch 17 latches the data of the memory array 16 corresponding to the first memory address A[23: 0] or the second memory address A[27: 0] so that the interface 11 can output the data within the data output time duration T4. The most significant bit (MSB) of the first memory address A[23: 0] is the bit A23, while the least significant bit (LSB) of the first memory address A[23: 0] is the bit A0. Similarly, the most significant bit (MSB) of the second memory address A[27: 0] is the bit A27, and the least significant bit (LSB) of the second memory address A[27: 0] is the bit A0.

Figure 4:
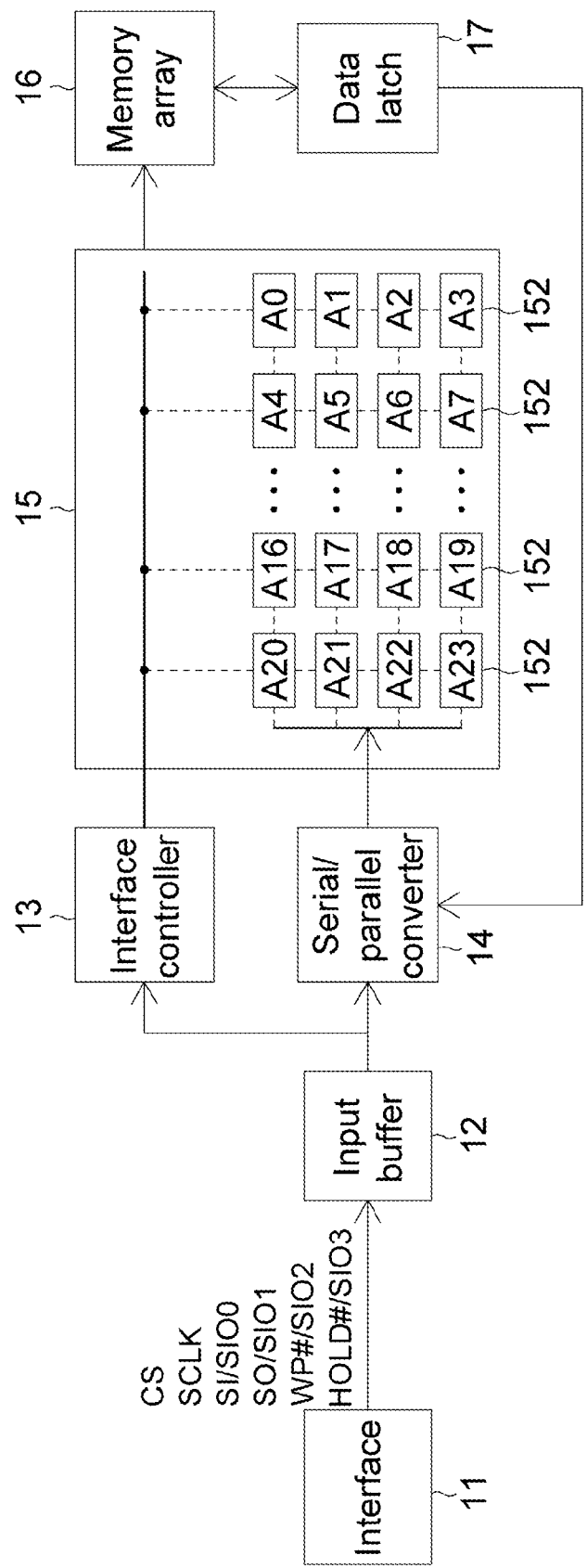
FIG. 4 is a schematic illustration showing that the serial flash memory is receiving the first memory address.

FIG. 4 is a schematic illustration showing that the serial flash memory is receiving the first memory address. As shown in FIGS. 3 and 4, if the first memory space is addressed according to the first address length, the interface 11 receives a first operation command BA within the command time duration T1, wherein the command time duration T1 ranges from the zeroth to seventh clocks of the clock signal SCLK. The interface 11 completely receives the first memory address A[23: 0] within the address time duration T2, and the address time duration T2 ranges from the $8^{th}$ to $13^{th}$ clocks. After the waiting time duration T3 ends, the data D0 to D7 corresponding to the first memory address are initially outputted from the starting clock ST. The waiting time duration T3 ranges from the $14^{th}$ to $19^{th}$ clocks of the clock signal SCLK, and the starting clock ST is the $20^{th}$ clock of the clock signal SCLK.

In detail, the address latch 15 further includes several registers 152. When the interface 11 receives the first memory address A[23: 0] within the address time duration T2, the bits A23 to A20 of the first memory address A[23: 0] are stored to the register 152 of the address latch 15 at the $8^{th}$ clock of the clock signal SCLK. Next, the bits A19 to A16 of the first memory address A[23: 0] are stored to the register 152 of the address latch 15 at the $9^{th}$ clock of the clock signal SCLK. Analogically, the bits A15 to A12, the bits A11 to A8, the bits A7 to A4 and the bits A3 to A0 of the first memory address A[23: 0] are sequentially stored to the registers 152 of the address latch 15 at the $10^{th}$, $11^{th}$, $12^{th}$ and $13^{th}$ clocks of the clock signal SCLK.

Figure 5:
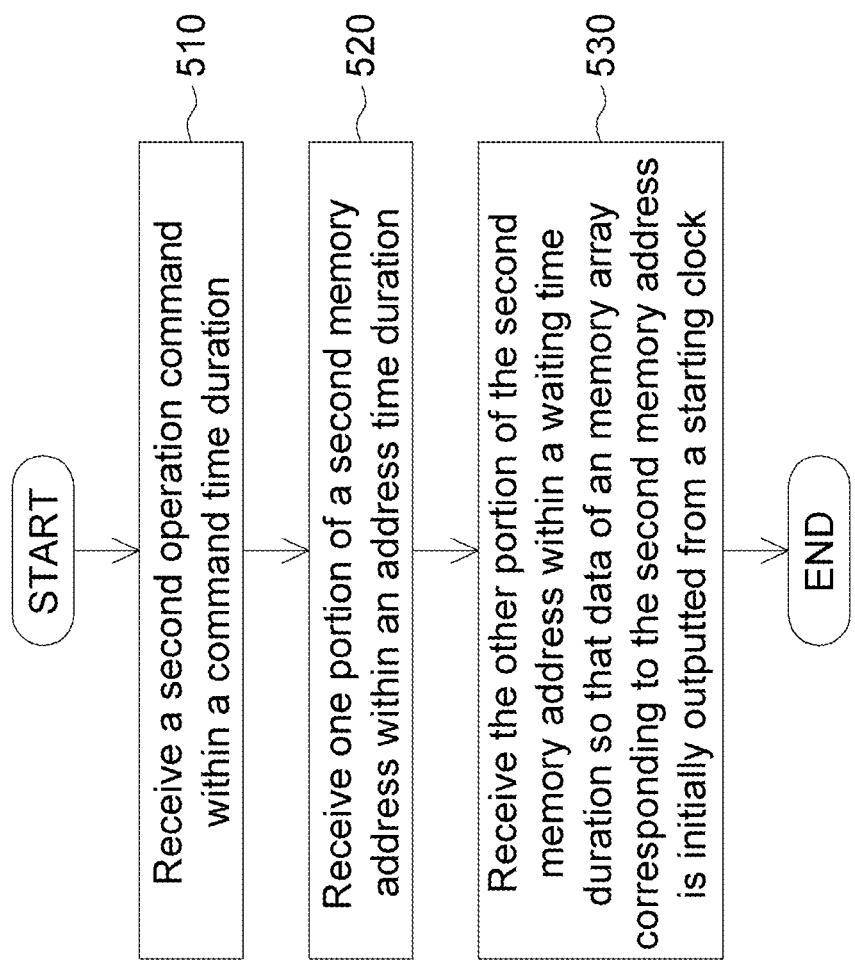
FIG. 5 is a flow chart showing an address transmission method of the serial flash memory.
Figure 7:
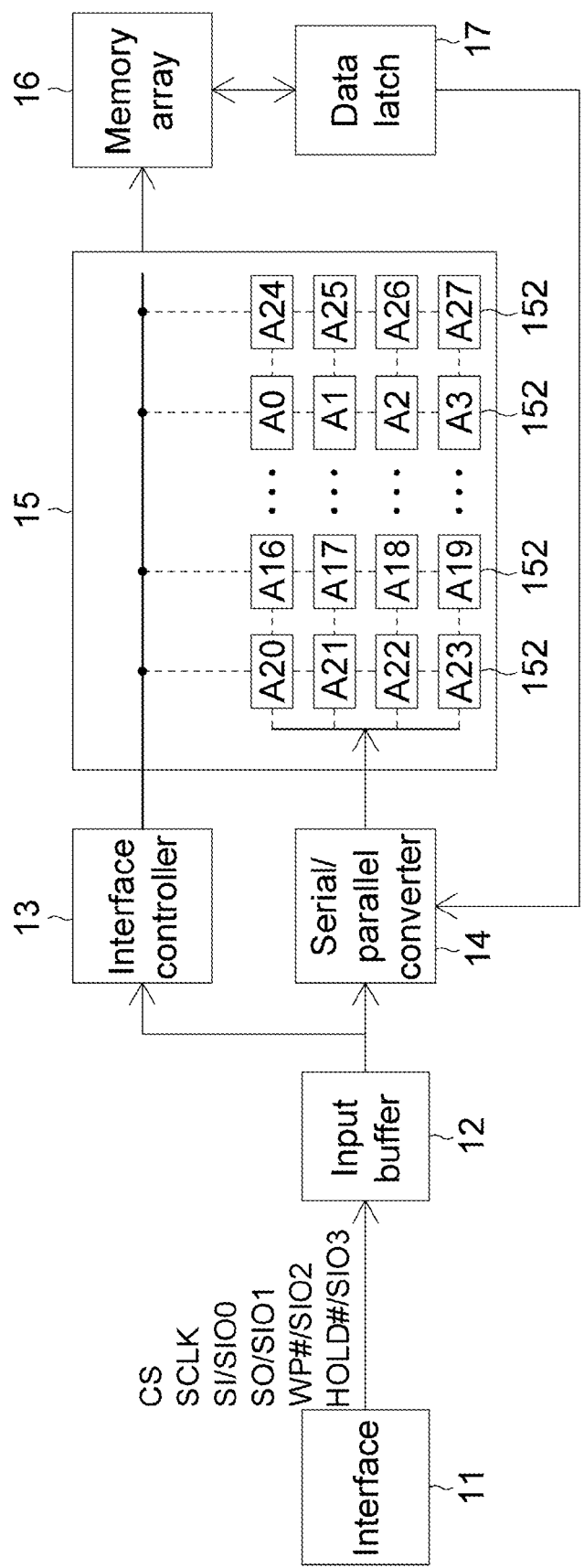
FIG. 7 is a schematic illustration showing that the serial flash memory is receiving the second memory address according to the first embodiment of the invention.

FIG. 5 is a flow chart showing an address transmission method of the serial flash memory. FIG. 7 is a schematic illustration showing that the serial flash memory is receiving the second memory address according to the first embodiment of the invention. As shown in FIGS. 5 to 7, the address transmission method of the serial flash memory 1 includes the following steps.

First, as shown in step 510, if the second memory space is addressed according to the second address length, the interface 11 receives a second operation command CA within the command time duration T1, which ranges from the $0^{th}$ to $7^{th}$ clocks of the clock signal SCLK. Next, as shown in step 520, the interface 11 receives one portion of the second memory address A[27: 0], such as bits A0 to A20, within the address time duration T2. The address time duration T2 ranges from the $8^{th}$ to $13^{th}$ clocks of the clock signal SCLK. Next, as shown in step 530, the interface 11 receives the other portion of the second memory address A[27: 0], such as the bits A24 to A27, within the waiting time duration T3, so that the data D0 to D7 of the memory array 16 corresponding to the second memory address A[27: 0] are initially outputted from the starting clock ST. The waiting time duration T3 ranges from the $14^{th}$ to $19^{th}$ clocks of the clock signal SCLK, and the starting clock ST is the 20th clock of the clock signal SCLK. The starting time of outputting the data corresponding to the first memory address A[23: 0] and the starting time of outputting the data corresponding to the second memory address A[27: 0] are kept unchanged in the case when the first memory space is addressed according to the first address length or the second memory space is addressed according to the second address length. In other words, the access time of the serial flash memory cannot be shortened even if the second memory space is addressed according to the second address length.

When the interface 11 receives the one portion of the second memory address A[27: 0] within the address time duration T2, the bits A23 to A20 of the second memory address A[27: 0] are stored to the register 152 of the address latch 15 at the $8^{th}$ clock of the clock signal SCLK. Next, the bits A19 to A16 of the second memory address A[27: 0] are stored to the register 152 of the address latch 15 at the $9^{th}$ clock of the clock signal SCLK. Analogically, the bits A15 to A12, the bits A11 to A8, the bits A7 to A4 and the bits A3 to A0 of the first memory address A[27: 0] are sequentially stored to the registers 152 of the address latch 15 at the $10^{th}$, $11^{th}$, $12^{th}$ and $13^{th}$ clocks of the clock signal SCLK. When the interface 11 receives the other portion of the second memory address A[27: 0] within the waiting time duration T3, the bits A24 to A27 of the second memory address A[27: 0] are stored to the register 152 of the address latch 15 at the $14^{th}$ clock of the clock signal SCLK.

It is to be specified that the serial flash memory 1 may decide to either address the first memory space according to the first address length or address the second memory space according to the second address length according to different operation commands. For example, if the interface 11 receives the first operation command BA within the command time duration T1, it represents that the first memory space is addressed according to the first address length. Oppositely, if the interface 11 receives the second operation command CA different from the first operation command BA within the command time duration T1, it represents that the second memory space is addressed according to the second address length.

In addition, the serial flash memory 1 may also decide to either address the first memory space according to the first address length or address the second memory space according to the second address length according to the same operation command but different modes. The first memory space and the second memory space respectively correspond to a first mode and a second mode. The first mode and the second mode respectively correspond to a first predetermined value and a second predetermined value of a flag. If the second memory space is addressed according to the second address length, the flag is set to be equal to the second predetermined value through a switch command. Oppositely, if the first memory space is addressed according to the first address length, the flag is set to be equal to the first predetermined value.

Second Embodiment

Figure 8:
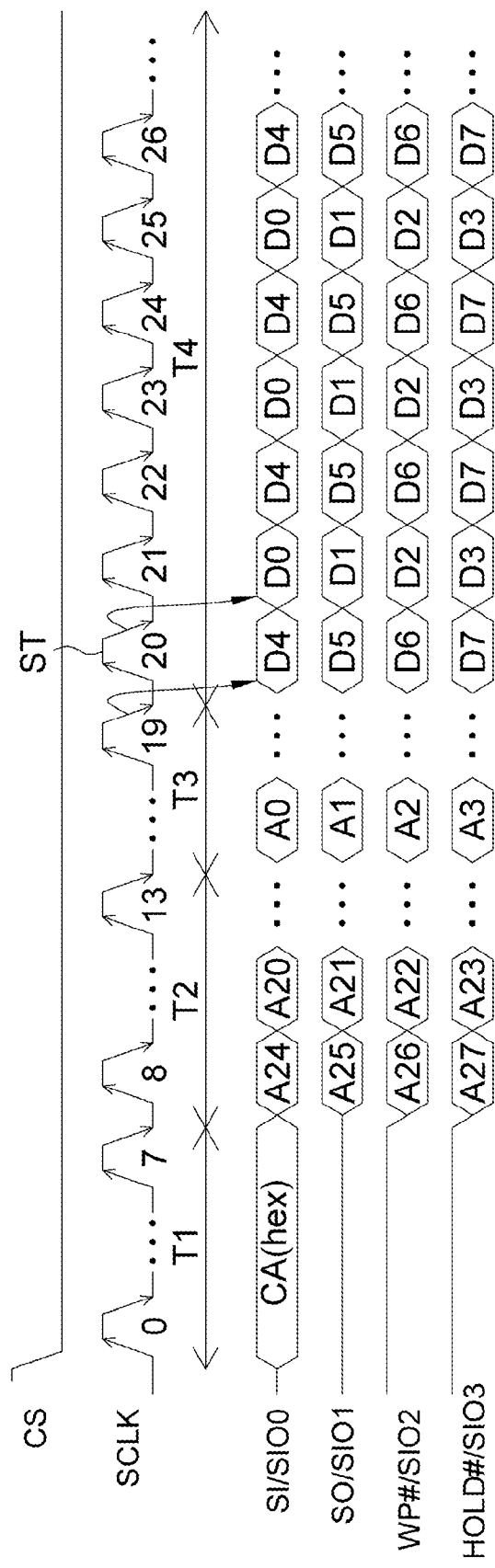
FIG. 8 is a signal timing diagram showing that a serial flash memory is receiving the second memory address according to a second embodiment of the invention.
Figure 9:
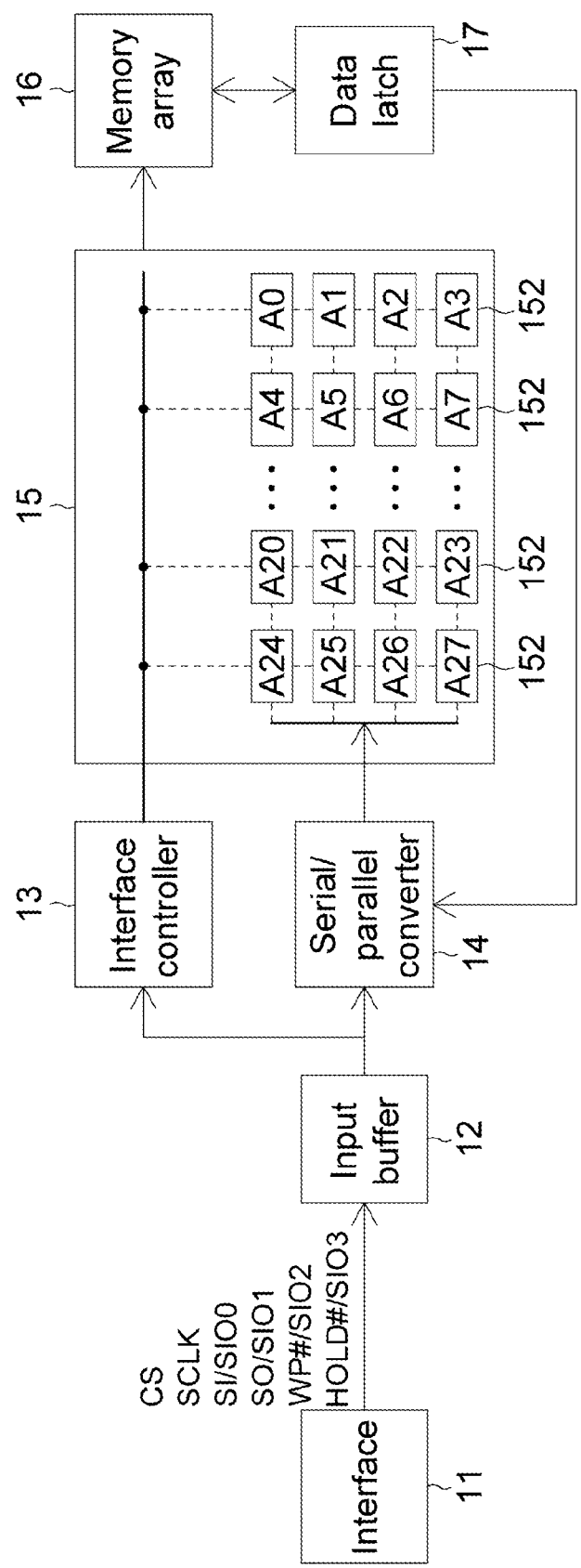
FIG. 9 is a schematic illustration showing that the serial flash memory is receiving the second memory address according to the second embodiment of the invention.

FIG. 8 is a signal timing diagram showing that a serial flash memory is receiving the second memory address according to the second embodiment of the invention. FIG. 9 is a schematic illustration showing that the serial flash memory is receiving the second memory address according to the second embodiment of the invention. As shown in FIGS. 8 and 9, the difference between the second embodiment and the first embodiment will be described in the following. In the first embodiment, the bits A0 to A23 of the second memory address A[27: 0] are received within the address time duration, and then the bits A24 to A27 of the second memory address A[27: 0] are received within the waiting time duration T3. In the second embodiment, however, the bits A4 to A27 of the second memory address A[27: 0] are firstly received within the address time duration, and then the bits A0 to A3 of the second memory address A[27: 0] are received within the waiting time duration T3.

The serial flash memory and the address transmission method thereof according to the embodiments of the invention have many advantages, some of which will be described in the following.

First, the memory space that may be addressed by the serial flash memory is increased.

Second, the starting time of outputting the data is kept unchanged.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An address transmission method of a serial flash memory, wherein the serial flash memory selectively addresses a first memory space according to a first address length or addresses a second memory space according to a second address length longer than the first address length, and a first memory address is completely received within an address time duration if the first memory space is addressed according to the first address length, so that data corresponding to the first memory address is initially outputted from a starting clock, wherein a waiting time duration exists between the address time duration and the starting clock, the address transmission method comprising the steps of:

receiving one portion of a second memory address within the address time duration if the second memory space is addressed according to the second address length, wherein address lengths of the first memory address and the second memory address are respectively equal to the first address length and the second address length; and receiving the other portion of the second memory address within a the waiting time duration so that data corresponding to the second memory address is initially outputted from the starting clock.

2. The method according to claim 1, further comprising the step of:

receiving a second operation command within a command time duration if the second memory space is addressed according to the second address length;

wherein if the first memory space is addressed according to the first address length, a first operation command different from the second operation command is received within the command time duration.

3. The method according to claim 1, wherein the first memory space and the second memory space respectively correspond to a first mode and a second mode.

4. The method according to claim 3, further comprising the step of:
setting a flag to be equal to a second predetermined value corresponding to the second mode if the second memory space is addressed according to the second address length;
wherein if the first memory space is addressed according to the first address length, the flag is set to be equal to a first predetermined value corresponding to the first mode.

5. The method according to claim 1, wherein the second memory address comprises (m+n) bits, the $1^{st}$ to $m^{th}$ bits of the second memory address are received within the address time duration, the $(m+1)^{th}$ to $(m+n)^{th}$ bits of the second memory address are received within the waiting time duration, the $1^{st}$ bit of the second memory address is a least significant bit (LSB) of the second memory address, and the $(m+n)^{th}$ bit of the second memory address is a most significant bit (MSB) of the second memory address.

6. The method according to claim 1, wherein the second memory address comprises (m+n) bits, the $(m+1)^{th}$ to $(m+n)^{th}$ bits of the second memory address are received within the address time duration, the $1^{st}$ to $m^{th}$ bits of the second memory address are received within the waiting time duration, the $1^{st}$ bit of the second memory address is a least significant bit (LSB) of the second memory address, and the $(m+n)^{th}$ bit of the second memory address is a most significant bit (MSB) of the second memory address.

7. A serial flash memory for selectively addressing a first memory space according to a first address length or addressing a second memory space according to a second address length longer than the first address length, the serial flash memory comprising:
a memory array; and
an interface, wherein:
if the first memory space is addressed according to the first address length, the interface completely receives a first memory address within an address time duration, so that data corresponding to the first memory address is initially outputted from a starting clock, wherein a waiting time duration exists between the address time duration and the starting clock;
if the second memory space is addressed according to the second address length, the interface receives one portion of a second memory address within the address time duration, and receives the other portion of the second memory address within the waiting time duration, so that data of the memory array corresponding to the second memory address is initially outputted from the starting clock; and address lengths of the first memory address and the second memory address are respectively equal to the first address length and the second address length.

8. The memory according to claim 7, wherein:
if the second memory space is addressed according to the second address length, the interface receives a second operation command within a command time duration; and
if the first memory space is addressed according to the first address length, the interface receives a first operation command different from the second operation command within the command time duration.

9. The memory according to claim 7, wherein the first memory space and the second memory space respectively correspond to a first mode and a second mode.

10. The memory according to claim 9, wherein:
if the second memory space is addressed according to the second address length, a flag is set to be equal to a second predetermined value corresponding to the second mode; and
if the first memory space is addressed according to the first address length, the flag is set to be equal to a first predetermined value corresponding to the first mode.

11. The memory according to claim 7, wherein the second memory address comprises (m+n) bits, the interface receives $1^{st}$ to $m^{th}$ bits of the second memory address within the address time duration, and receives the $(m+1)^{th}$ to $(m+n)^{th}$ bits of the second memory address within the waiting time duration, the $1^{st}$ bit of the second memory address is a least significant bit (LSB) of the second memory address, and the $(m+n)^{th}$ bit of the second memory address is a most significant bit (MSB) of the second memory address.

12. The memory according to claim 7, wherein the second memory address comprises (m+n) bits, the interface receives the $(m+1)^{th}$ to $(m+n)^{th}$ bits of the second memory address within the address time duration, and receives the $1^{st}$ to $m^{th}$ bits of the second memory address within the waiting time duration, the $1^{st}$ bit of the second memory address is a least significant bit (LSB) of the second memory address, and the $(m+n)^{th}$ bit of the second memory address is a most significant bit (MSB) of the second memory address.

13. The memory according to claim 7, further comprising:
a serial/parallel converter for converting the first memory address or the second memory address, which is serially inputted from the interface, into the first memory address or the second memory address outputted in parallel.

14. The memory according to claim 13, further comprising:
an address latch; and
an interface controller for controlling the address latch to latch the first memory address or the second memory address outputted in parallel.

* * * * *